(12) United States Patent
Liao et al.

(10) Patent No.: US 10,023,707 B2
(45) Date of Patent: Jul. 17, 2018

(54) THERMOSETTING RESIN COMPOSITION AND PREPREG AS WELL AS HARDENED PRODUCT USING THE SAME

(71) Applicant: NAN YA PLASTICS CORPORATION, Taipei (TW)

(72) Inventors: Te-Chao Liao, Taipei (TW); Dein-Run Fung, Taipei (TW); Ying-Te Huang, Taipei (TW); Hao-Sheng Chen, Taipei (TW); Hung-Yi Chang, Taipei (TW); Chia-Lin Liu, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 327 days.

(21) Appl. No.: 14/973,809

(22) Filed: Dec. 18, 2015

(65) Prior Publication Data
US 2016/0177082 A1    Jun. 23, 2016

(30) Foreign Application Priority Data
Dec. 23, 2014    (TW) .............................. 103144922 A

(51) Int. Cl.
| | | |
|---|---|---|
| *C08L 51/08* | (2006.01) | |
| *H05K 1/09* | (2006.01) | |
| *H05K 1/03* | (2006.01) | |
| *C08J 5/04* | (2006.01) | |
| *C08J 5/24* | (2006.01) | |
| *C08J 3/24* | (2006.01) | |
| *C08L 71/12* | (2006.01) | |

(52) U.S. Cl.
CPC ................. *C08J 5/24* (2013.01); *C08J 3/246* (2013.01); *C08L 71/126* (2013.01); *H05K 1/032* (2013.01); *C08J 2351/08* (2013.01); *C08J 2409/00* (2013.01); *C08L 2205/025* (2013.01); *C08L 2205/03* (2013.01); *C08L 2205/05* (2013.01); *H05K 1/0366* (2013.01); *H05K 1/0373* (2013.01); *H05K 2201/012* (2013.01); *H05K 2201/0209* (2013.01)

(58) Field of Classification Search
None
See application file for complete search history.

(56) References Cited

U.S. PATENT DOCUMENTS

2012/0315814 A1* 12/2012 Fung ........................ C08L 9/00
442/117

FOREIGN PATENT DOCUMENTS

EP    2141198 A1 *    1/2010    ............. B32B 15/14

* cited by examiner

*Primary Examiner* — Christopher M Rodd
(74) *Attorney, Agent, or Firm* — Bacon & Thomas PLLC

(57) ABSTRACT

A thermosetting resin composition due to containing a modified PPE resin as a main ingredient is suited for use in making a pregreg or a copper foil substrate, when hardened, featuring a small dielectric constant (Dk), a low dielectric dissipation factor (Df) and a high Tg as well as a high resistance to heat and flame, this outstanding result is because the modified PPE resin is formed with a novel two-dimensional hardenable structure prepared to have side-chain reactive functional groups being provided in addition to those at the terminal ends of the main chain of the PPE resin thereof.

15 Claims, No Drawings

THERMOSETTING RESIN COMPOSITION AND PREPREG AS WELL AS HARDENED PRODUCT USING THE SAME

BACKGROUND OF THE INVENTION

1. Technical Field

The present invention relates to a thermosetting resin composition, and more particularly to a hardenable composition containing modified thermosetting polyphenylene ether and to a prepreg and a copper foil substrate formed with the composition.

2. Description of Related Art

In addition to being inexpensive, epoxy resins are highly insulating and chemical-resistant when cured and therefore have been extensively used as the insulating layer material of the conventional printed circuit boards. In recent years, however, the rapid advancement of high-frequency and broadband communication devices and equipment, the doubling of signal transmission rate and data processing loads, and the trend toward high-density electronic equipment and electronic assemblies have driven the development of printed circuit boards toward even finer lines, smaller line pitches, higher layer count, and smaller board thicknesses such that epoxy resins are becoming inadequate in terms of electrical performance, water absorbency, flame retardancy, dimension stability, and so on.

Compared with epoxy resins, polyphenylene ether (PPE) resins better meet the insulating material requirements of circuit boards, thanks to their excellent insulating abilities, acid and base resistance, small dielectric constants (Dk), and low dielectric dissipation factor (Df). Nevertheless, commercially available PPE resins have problem being directly applied to circuit board production because they are mostly thermoplastic, have overly high molecular weights (with number-average molecular weights greater than 20,000), and are neither easily soluble in solvents nor readily compatible with epoxy resins. Many research and development efforts have been made to overcome the foregoing drawbacks of PPE resins, with a view to modifying PPE resins into curable, more compatible, and more workable resin materials while preserving their outstanding electrical properties.

Regarding the low solubility as well as the low compatibility of PPE resins, U.S. Pat. No. 7,282,554 teaches polymerizing 2,6-dimethylphenol with an oxygen-containing gas and a proper metal-ion and amine catalyst to obtain a low-molecular-weight and hence highly soluble PPE. As the synthesis process uses oxygen as its oxygen source, industrial production may present the risk of explosion. Moreover, the metal-ion and amine catalyst used in the synthesis tends to have residues that may compromise the properties and heat resistance of the product once the product is hardened.

U.S. Pat. No. 5,880,221 discloses using monophenol and bisphenol monomers to redistribute and adjust the molecular weight of a PPE resin so as to improve the resin's solubility and workability. However, the characteristics and quantity of the terminal functional groups of the PPE after molecular weight redistribution are not disclosed, nor are the electrical properties of the redistributed PPE when it is hardened.

U.S. Pat. No. 7,858,726 applies molecular weight redistribution to the conversion of a high-molecular-weight PPE resin into a low-molecular-weight PPE resin. While the resulting resin has higher solubility than before the conversion, the hydroxyl groups at the terminal ends of the molecule chain are polar groups which, though hardenable, may increase dielectric loss. Furthermore, as the number of hydroxyl groups of each PPE molecule is on average less than 2, the percentage of active groups that allow hardening is insufficiently low, and a low crosslinking density follows. If insufficient active groups lead to inadequate crosslinking after hardening, heat resistance will be impaired.

U.S. Pat. No. 7,141,627 mentions the drawbacks of hardening with hydroxyl groups. Although hydroxyl groups can serve as the active groups for hardening, an exceedingly large number of hydroxyl groups may undergo incomplete reaction during the hardening process, and the residual hydroxyl groups will lead to high dielectric loss and excessive water absorbency of the hardened board. As such, hardening with hydroxyl groups provides little, if any, improvement on the electrical properties and water absorbency of a material that demands a small dielectric constant and low dielectric loss.

U.S. Pat. No. 7,341,783 proposes epoxidizing a PPE resin in a high-pressure reaction vessel, and yet the powdery product is unsuitable for use in circuit boards because some hydroxyl groups remain in the resin's structure.

U.S. Pat. No. 6,352,782 discloses capping the terminal groups of a PPE resin with other unsaturated groups, but the resulting structure has functional groups on only one side and, when used in a circuit board, tends to cause insufficient hardening as well as difficulties in preparing the resin composition for pre-impregnation.

U.S. Pat. No. 6,051,662 discloses a resin composition modified with maleic anhydride, methyl methacrylate, and a PPE resin. The composition has a dielectric constant greater than 4.1 and hence cannot be used in high-frequency low-dielectric-constant applications.

U.S. Pat. No. 5,352,745 teaches a curable resin composition containing a PPE resin. As the resin composition also includes a phenolic resin and therefore still falls into the category of polar group-containing resins, it has a large dielectric constant and high dielectric loss when cured.

US Patent Application Publication No. 2012-0315814A1 discloses a high-frequency substrate with outstanding electrical properties, but the high percentage, up to 55%, of butadiene resin in the composition tends to render the prepreg too soft and therefore difficult to cut. Consequently, frequent cutter replacement is required and will incur additional production cost.

U.S. Pat. No. 8,703,277 teaches a composition made from PPEs of different molecular weights and with good electrical properties. However, the highest glass transition temperature of the composition is only 210° C. due to the fact that the higher-molecular-weight PPE in the composition has not been modified to provide functional groups capable of crosslinking.

In the prior art, such as U.S. Pat. Nos. 5,880,221 and 7,858,726, PPE resin redistribution by means of a bisphenol or monophenol monomer is indeed capable of producing a thermosetting PPE resin with terminal hydroxyl groups, but such a thermosetting PPE resin is disadvantageous in that only a small number of the hydroxyl groups are available for hardening purposes, that the percentage of active groups is low, and that heat resistance may be compromised by the low crosslinking density after hardening. Another disadvantage is disclosed by U.S. Pat. No. 7,141,627, when hydroxyl groups are used as the functional groups for hardening, polar groups will be generated during the hardening process and have adverse effects on the dielectric constant and dielectric loss of the hardened board, and the high water absorbency of the board is very likely to result in delamination.

While the electrical properties of a PPE resin with terminal hydroxyl groups can be improved by grafting non-polar groups (e.g., unsaturated groups such as alkenyl groups and alkynyl groups) onto the terminal hydroxyl groups before hardening, the resulting structure is still one-dimensional (i.e., linear) and, when hardened, therefore, still has a low crosslinking density and hence insufficient resistance to heat.

SUMMARY OF THE INVENTION

In light of the above, it is an objective of the present invention to provide a modified thermosetting polyphenylene ether (PPE) resin which has more non-polar unsaturated function groups than its prior art counterparts. More specifically, side-chain reactive functional groups are provided in addition to those at the terminal ends of the main chain of the PPE resin to form a two-dimensional hardenable structure. By doing so, not only can crosslinking density and heat resistance be increased, but also better electrical properties can be achieved. Moreover, in absence of polar groups helps reduce the dielectric constant and dielectric loss significantly.

The modified thermosetting PPE resin of the present invention has different unsaturated active groups at the terminal ends of its main chain and at least one unsaturated active group at a side-chain position such that a thermosetting PPE resin whose functional groups are specially arranged with respect to the main chain is formed. This structure enables a substantial reduction in the dielectric constant and dielectric loss and also an increase in crosslinking density to facilitate a prepreg cutting if the prepreg is impregnated with the PPE resin thereof.

Another objective of the present invention is to provide a modified thermosetting PPE resin in which the PPE resin has a different molecular weight distribution from its conventional equivalents. More specifically, a plurality of unsaturated functional groups are specially arranged with respect to the main chain to effect hardening so that, once the resin is hardened, a higher crosslinking density than in the prior art can be achieved along with a higher glass transition temperature (Tg), higher heat resistance, a smaller dielectric constant (Dk), and lower dielectric dissipation factor (Df).

Yet another objective of the present invention is to provide a thermosetting PPE resin having a proper molecular weight and an asymmetric side-chain structure. This molecular weight and structure help enhance solubility in solvents, compatibility with epoxy resins, and workability.

Still another objective of the present invention is to provide a simple, safe, and low-cost method for synthesizing a thermosetting PPE resin.

A further objective of the present invention is to provide a thermosetting resin composition based on the aforesaid thermosetting PPE resin with a staggered structure as a main ingredient, wherein the resin composition includes:
a) a butadiene resin making up 2-15 wt %, by weight of the total solid content of the resin composition;
b) the thermosetting PPE resin, which makes up 30-45 wt % of the total solid content of the resin composition;
c) inorganic powder making up 10-35 wt %, by weight of the total solid content of the resin composition;
d) a flame retardant making up 10-20 wt %, by weight of the total solid content of the resin composition;
e) a crosslinking agent making up 2-20 wt %, by weight of the total solid content of the resin composition; and
f) a hardening initiator making up 0.1-3 wt %, by weight of the total solid content of the resin composition.

The thermosetting resin composition of the present invention not only features improvement in physical properties, but also facilitates the process for cutting of prepregs. More specifically, a prepreg formed with the resin composition will not be too soft and can be easily cut during production. Thus, frequent cutter replacement is unnecessary, and the associated cost can be saved. This is of particular advantage in server applications where multilayer printed circuit boards are used. Furthermore, a prepreg formed with the resin composition can make a copper foil substrate which has high rigidity when hardened.

Still another objective of the present invention is to apply the foregoing resin composition to semi-cured films (or B-stage prepreg), cured films (or prepreg), and copper foil substrates (formed by laminating a pre-impregnated glass cloth with copper foil) for use in printed circuit boards, and to circuit boards made of such copper foil substrates. As the composition includes the aforesaid thermosetting PPE resin with a staggered structure, the composition, when hardened, features a small dielectric constant (Dk), a low dielectric dissipation factor (Df), a high Tg, a high resistance to heat and flame, a high solubility in solvents, and a high compatibility with other resins. More specifically, the composition, when hardened, has such excellent electrical properties as a dielectric constant (Dk) less than 3.2 and a dielectric dissipation factor (Df) less than 0.002 at the frequency of 1 GHz. Besides, the glass transition temperature (Tg) is higher than 205° C., and resistance to 288° C. solder heat lasts more than 600 seconds. These advantages of the thermosetting PPE resin composition enable the production of high-standard printed circuit boards.

DETAILED DESCRIPTION OF THE INVENTION

The present invention discloses a modified thermosetting polyphenylene ether (PPE) resin provided with a chemical structural formula (A) as followed, of which molecule has at least one or more unsaturated active functional groups at both terminal ends and lateral sides, i.e., the molecule of the modified thermosetting PPE resin of the present invention is prepared to have both one or more terminal unsaturated active functional groups (Q1, Q2) at terminal ends of the main chain and one or more lateral unsaturated active functional groups (R1-R12) at side chains of benzene rings:

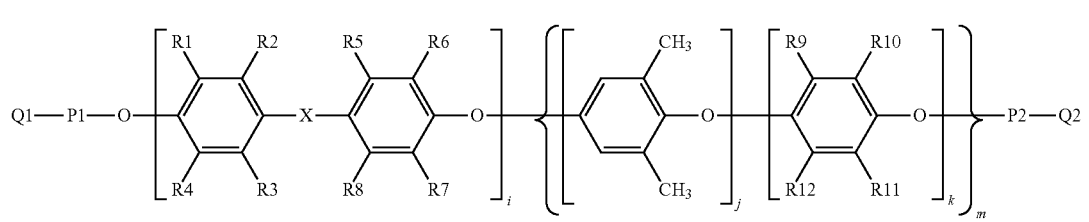

where R1-R8 each is selected from allyl groups, hydrogen groups or $C_1$-$C_6$ alkyl groups singly, or in combination thereof; and from R9 to R12 at least has one of them being selected from an allyl group, while each of the rest is selected from a hydrogen group or a C1-C6 alkyl group singly;

where X is selected from one of groups as follows:

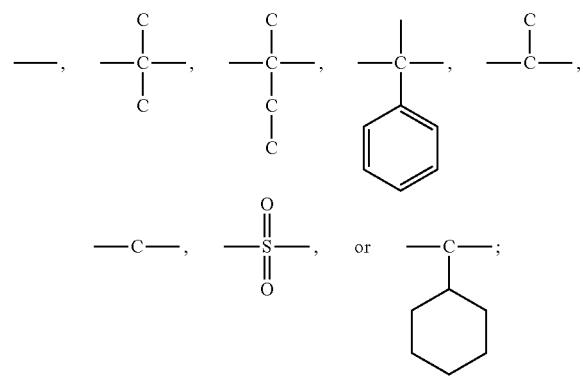

where i, j, k, and m are integers, i is 0 or 1; k≥0; j=1-170; and m≥1; and where P1 and P2 is selected from

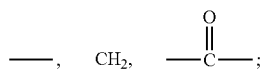

Q1 and Q2 each is selected from a styryl group, a phenylethynyl group, an alkynyl group, a vinyl group, a methyl vinyl group, a benzene ring, a naphthalene ring, or a hydrogen group.

There are two types of method for preparing the modified thermosetting PPE resin of the present invention and described as follows, but is by no means limited to these two:

1. a first type is a known oxidation polymerization process for producing PPE; 2,6-dimethyl phenol (abbreviated as 2,6-DMP) is reacted with oxygen ($O_2$) or air in the presence of an organic solvent and a copper-amine complex-based catalyst to effect oxidative polymerization of carbon and oxygen atoms as C—O. For modification purposes, 2,6-DMP may also copolymerize with a phenolic compound with the desired functional groups. As the PPE resin obtained by oxidative polymerization still has a certain number of hydroxyl groups at the terminal ends of its molecule chain, different reactive functional groups can be imparted to the PPE resin by a grafting reaction at the terminal ends; and 2. a second type is to effect a cracking reaction between a phenolic compound and a peroxide so that an unfunctionalized high-molecular-weight PPE resin is cracked into a low-molecular-weight PPE. The PPE resin obtained by cracking still has a certain number hydroxyl groups at the terminal ends of its molecule chain, so different reactive function groups can also be imparted to the PPE resin by a grafting reaction at the terminal ends. For example, different reactive functional groups can be imparted to the resulting low-molecular-weight PPE via a bisphenol with such functional groups.

Herein, a high-molecular-weight PPE resin refers to a PPE resin whose number-average molecular weight (Mn) is higher than 20,000. Such a high-molecular-weight PPE resin is commercially available and need not be refined or pretreated. Measurement of the molecular weight is carried out as follows:

a fixed amount of PPE resin is dissolved in a THF solvent to prepare a 1% solution. The solution is heated to 50° C. and set aside until clarified. Then, gel permeation chromatography (GPC) is performed, and the areas of the characteristic peaks are calculated to obtain the molecular weight. Prior to the execution of GPC, a calibration curve must be established for molecular weights and characteristic peak areas by performing multi-point calibration on standard polystyrene specimens of different molecular weights. Only when the calibration curve is created can the molecular weight data of a sample to be tested be accurately obtained.

The preparation method of the present invention mentioned above uses a bisphenol having the following formula (B):

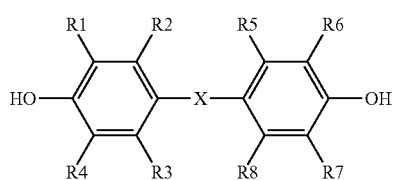

where R1-R8 each is selected from allyl groups, hydrogen groups or $C_1$-$C_6$ alkyl groups singly, or in combination thereof; and where X is selected from one of groups as follows:

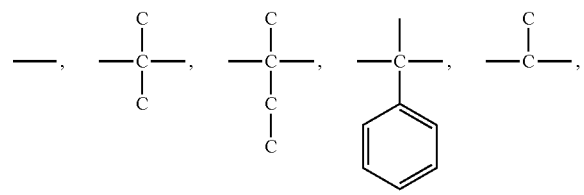

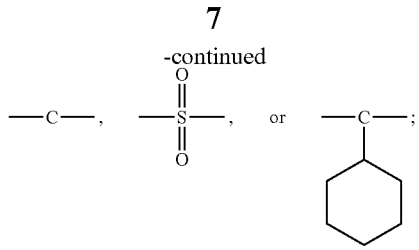

and among other things, where X is at least one selected from the group consisting of diallyl bisphenol A, diallyl bisphenol B, diallyl bisphenol BP, diallyl bisphenol E, diallyl bisphenol S, diallyl bisphenol F, diallyl biphenol, diallyl bisphenol Z, bisphenol A, bisphenol B, bisphenol BP, bisphenol E, bisphenol S, bisphenol F, biphenol, bisphenol Z and 9,9-bis(4-hydroxyphenyl) fluorene.

To protect the bisphenol kept to have one or more allyl groups thereof, it is feasible to add a retarder at 0-0.2 wt % to adjust the reactivity of free radicals; otherwise, the allyl structure on the benzene rings may be damaged by a violent reaction.

The retarder is at least one selected from the group consisting of benzoquinone, nitrobenzene, 1,1-diphenyl-2-picrylhydrazyl (DPPH), 4,6-dinitro-2-sec-butylphenol (DNBP), 2,6-dinitro-p-cresol (DNPC) and di-tert-butylhydroquinone.

The reactive solvent used in the preparation method of the present invention mentioned above is selected from a toluene, a xylene, a methyl isobutyl ketone (MIBK) or a methyl ethyl ketone (MEK) singly, or a mixture of the above.

A thermal initiator if chosen for use in the preparation method of the present invention mentioned above is selected from a benzoyl peroxide, a dicumyl peroxide, a 2,5-dimethyl-2,5-di(tert-butylperoxy) hexane (DHBP), a di-tertiary-butyl peroxide (DTBP), tert-butyl peroxybenzoate (TBPB) or the like.

According to the method for preparing a modified thermosetting PPE resin of the present invention mentioned above, the hydroxyl groups at the terminal ends of the PPE resin molecule chain are modified by grafting. The mechanism of the grafting reaction is based on nucleophilic substitution. More specifically, the terminal hydroxyl groups of the small-molecular-weight PPE resin are subjected to a sodium salt or kali salt forming process to form terminal phenoxide.

The terminal phenoxide of the modified PPE resin is highly reactive and can react with such monomers as halide, acid halide, and acid anhydride. According to the present invention, grafting is performed by introducing an acid monomer (e.g., a halide, an acid halide, or an acid anhydride) with unsaturated active groups (e.g., alkenyl or alkynyl groups) in the presence of a phase transfer catalyst so that the acid monomer acts as a terminal-blocking as well as grafting monomer. When the grafting reaction is completed, residues of the monomer are attached to the oxygen atoms at the terminal ends of the PPE main chain, thus forming a modified thermosetting PPE resin with a staggered structure.

The modified thermosetting PPE resin of the present invention has one or more compounds of the chemical structural formula (A), characterized in that which comprises the unsaturated functional groups P1, P2, Q1, and Q2 at the terminal ends of the main chain as well as the unsaturated functional groups R1-R12 at side chains of the benzene rings:

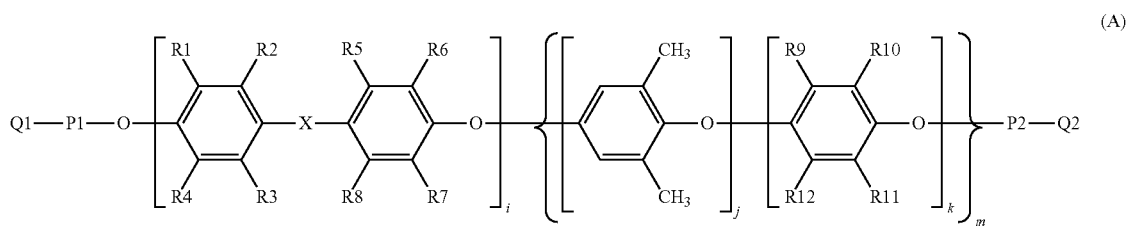

where R1-R8 each is selected from allyl groups, hydrogen groups or $C_1$-$C_6$ alkyl groups singly, or in combination thereof; and from R9 to R12 at least has one of them being selected from an allyl group, while each of the rest is selected from a hydrogen group or a C1-C6 alkyl group singly;

where X is selected from one of groups as follows:

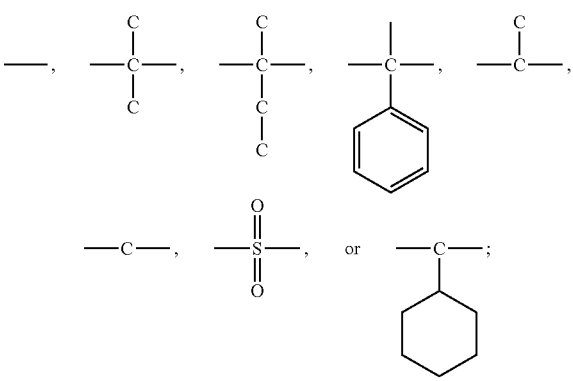

where i, j, k, and m are integers, i is 0 or 1; k≥0; j=1-170; and m≥1; and where P1 and P2 is selected from

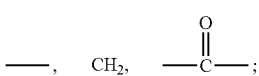

Q1 and Q2 each is selected from a styryl group, a phenylethynyl group, an alkynyl group, a vinyl group, a methyl vinyl group, a benzene ring, a naphthalene ring, or a hydrogen group.

In the preparation method of producing the PPE resin of the present invention, the grafting monomer is a halide, an acid halide, or an acid anhydride with unsaturated active groups. More specifically, the grafting monomer is at least one selected from the group consisting of 4-vinylbenzyl chloride, acryloyl chloride, 3-bromo-1-propyne, 3-chloro-1-propyne, 3-chloro-propene, 3-bromo-propene, chloromethyl-benzene, 1-chloromethyl naphthalene, benzoyl chloride, naphthalene chloride, 4-ethynylbenzoyl chloride, 4-ethynylbenzoyl bromide, 4-ethynyl-2-fluorobenzoyl chloride, 4-vinylbenzoyl chloride, benzoic anhydride and methacrylic anhydride.

In the preparation method of producing the PPE resin of the present invention, alkaline metal phenolation of the terminal hydroxyl groups of the PPE resin is achieved by reacting with an alkali metal ion-containing aqueous solution selected from the group consisting of an aqueous solution of sodium hydroxide, an aqueous solution of potassium hydroxide, an aqueous solution of sodium carbonate and an aqueous solution of potassium carbonate.

In the preparation method of producing the PPE resin of the present invention, the phase transfer catalyst is at least one selected from the group consisting of tetraethylammonium bromide (TEAB), tetrabutylammonium bromide (TBAB), hexadecyl trimethyl ammonium bromide (HTAB) and tetrabutylammonium hydrogen sulphate (TBAHS).

In the preparation method of producing the PPE resin of the present invention, the grafting reaction temperature ranges from 50° C. to 120° C., preferably from 60° C. to 90° C.

In the preparation method of producing the PPE resin of the present invention, the solid content of the grafting reaction solution is 10-50%, preferably 25-40%.

According to the preparation method of producing the PPE resin of the present invention, a thermosetting PPE resin of the formula (A) mentioned above can be purified by precipitation and by washing several times, in order to remove unreacted monomer molecules, residual metal ions, and like impurities and thereby obtain a PPE resin with high-purity and low-molecular-weight.

In the preparation method of producing the PPE resin of the present invention, precipitation is performed by dissolving the to-be-purified PPE resin with a good solvent to produce a solution; adding the solution, in droplets, into a purifying solvent, or more particularly a poor solvent of the PPE resin, in order for the PPE resin to precipitate in the form of powder; and then separating the PPE resin by a solid-liquid separation method (e.g., filtration or centrifugation).

The poor solvent can be methanol, ethanol, propanol, butanol, or a mixture of the above. The ratio of the poor solvent to the PPE resin solution is 3:1-10:1, preferably 4:1-6:1.

In the preparation method of producing the PPE resin of the present invention, washing several times refers to washing the PPE resin powder superficially with a solvent selected from the group consisting of water, methanol, ethanol, propanol, butanol and MEK, or a mixture of the above.

According to the preparation method of producing the PPE resin of the present invention, the PPE resin obtained has a chlorine content lower than 800 ppm and a metal content lower than 5 ppm.

According to the preparation method of producing the PPE resin of the present invention, the modified thermosetting PPE resin obtained is characterized in that the unsaturated active groups at the terminal ends of the main chain and at least one unsaturated active group at a side-chain position of the molecule of the PPE resin; and more particularly, resulted in that a modified thermosetting resin whose functional groups are specially arranged with respect to the main chain is obtained.

The number-average molecular weight of the modified PPE resin of the present invention is greater than 2,000 and less than or equal to 25,000; and the modified PPE resin of the present invention, when hardened, has a higher glass transition temperature (Tg), a higher resistance to heat, a smaller dielectric constant (Dk) and a lower dielectric dissipation factor (Df) than its prior art counterparts, in addition to excellent workability.

The present invention also discloses a modified PPE resin composition, or more particularly, the modified PPE resin composition of the present invention is based on the aforesaid modified thermosetting PPE resin as a main ingredient.

The modified PPE resin composition of the present invention comprises butadiene resins, the modified thermosetting PPE resins having the chemical structural formula (A) mentioned above, inorganic powders, flame retardants, crosslinking agent and hardening initiator. The functions, mixing proportions, and structures of the ingredients of the composition are detailed as follows:

(a) butadiene resin, which makes up 2-15 wt %, preferably 2-9 wt %, by weight of the total solid content of the resin composition, and includes a high-molecular-weight polybutadiene resin (a-1) and a low-molecular-weight polybutadiene resin (a-2) as follows:

(a-1) high-molecular-weight polybutadiene resin, whose weight-average molecular weight (Mw) is higher than 100,000 g/mol, and which makes up 0-13 wt % by weight of the total solid content of the resin composition, and also includes more than 70 wt %, preferably more than 90 wt %, of 1,2-vinyl.

(a-2) low-molecular-weight polybutadiene resin, whose weight-average molecular weight (Mw) is 1,000-10,000 g/mol, and which makes up 2-15 wt % by weight of the total solid content of the resin composition, and also includes more than 70 wt %, preferably more than 90 wt %, of 1,2-vinyl.

Taking the sum of weights of (a-1) and (a-2) as 100 wt %, and considering the surface uniformity of prepregs and workability, the preferred ratio of (a-1):(a-2) is from 0:100 wt % to 50:50 wt %.

The purpose of said polybutadiene resins containing more than 70 wt % of vinyl is to provide a large amount of unsaturated vinyl, which is required for crosslinking and hardening, and to increase the crosslinking density so that a prepreg according to the present invention and a circuit board made therewith have excellent resistance to high heat.

(b) the modified thermosetting PPE resin, having the chemical structural formula (A) mentioned above and formed as a major resin ingredient for the composition, which makes up 30-45 wt %, by weight of the total solid content of the resin composition.

The modified thermosetting PPE resin of the present invention has a number-average molecular weight (Mn) of greater than 2,000 and less than or equal to 25,000, preferably 2,000-22,000. If the number-average molecular weight is higher than 25,000, both solubility and workability will be impaired. If the number-average molecular weight is lower than 2,000, the resin's solubility in solvents and workability during impregnation will be enhanced, but good physical properties such as glass transition temperature (Tg), dielectric constant (Dk) and dielectric dissipation factor (Df) cannot be achieved with such a low molecular weight.

As mentioned above, the molecule of the modified thermosetting PPE resin of the present invention is prepared to have both one or more terminal unsaturated active functional groups at terminal ends and one or more lateral unsaturated active functional groups. The number of terminal functional groups that to allow grafting can be determined according to the OH value, whose evaluation method is defined in the embodiments provided further below.

When the number-average molecular weight (Mn) of the modified thermosetting PPE resin of the present invention is greater than 2,000 and less than or equal to 13,000, the OH value is smaller than 3.0 mgKOH/g, preferably smaller than 2.0 mgKOH/g, and can be as small as 0.001 mgKOH/g. This ensures that there are enough functional groups for reaction and for achieving good physical properties, e.g., glass transition temperature (Tg) and heat resistance.

When the number-average molecular weight (Mn) of the modified thermosetting PPE resin of the present invention is greater than 13,000 and less than or equal to 25,000, the high molecular weight guarantees a high glass transition temperature (Tg) and high resistance to heat, so some OH groups at the terminal ends can be preserved to improve solubility in solvents. In such cases, the OH value is preferably smaller than 10.0 mgKOH/g, more preferably smaller than 7.0 mgKOH/g. If the OH value is smaller than 3.0 mgKOH/g, suggesting the presence of a relatively large number of graftable unsaturated active functional groups at the terminal ends, good physical properties can also be achieved. If, however, the OH value is greater than 10.0 mgKOH/g, suggesting an insufficiently small number of graftable functional groups at the terminal ends, the physical properties obtained after hardening (e.g., glass transition temperature (Tg) or heat resistance) may fall short of expectations, and delamination tends to occur to a laminated board made with such a resin composition. To facilitate control, therefore, the OH value is usually kept between 0.001 and 10.0 mgKOH/g.

The overall OH value of the thermosetting PPE resin of the present invention preferably ranges from 0.001 to 10.0 mgKOH/g, more preferably from 0.01 to 7.0 mgKOH/g. An OH value greater than 10.0 mgKOH/g indicates insufficiency of graftable functional groups at the terminal ends and may lead to unsatisfactory physical properties (e.g., glass transition temperature (Tg) or heat resistance) after hardening; as a result, the chances of board delamination are high.

The overall OH value of the thermosetting PPE resin of the present invention can be adjusted by using a plurality of the aforesaid thermosetting PPE resins, each of a different molecular weight, and by adjusting the ratio between the PPE resins as appropriate. The smaller the OH value, the more functional groups the PPE resins used in the formula have for reaction, and hence the lower the lamination temperature required for the composition (desirable physical properties can be achieved with a lamination temperature of 150-190° C.).

(c) inorganic powder, which makes up 10-35 wt % of the total solid content of the resin composition and serves mainly to improve the mechanical strength and dimension stability of the resin composition in the hardened state. The ingredient/ingredients of the inorganic powder is/are one or more selected from the group consisting of: spherical or irregular silicon dioxide ($SiO_2$), $TiO_2$, $Al(OH)_3$, $Al_2O_3$, $Mg(OH)_2$, magnesia (MgO), $CaCO_3$, and fumed silica particles. The average particle size of the inorganic powder preferably ranges from 0.01 to 20 µm. Fumed silica is porous nano-sized silica particles, with an average particle size of 1-100 nm, and can be added at 0.1-10 wt %. If the percentage of fumed silica exceeds 10 wt %, the viscosity of the resin composition will be increased, making the composition difficult to work with. Silicon dioxide, on the other hand, can be added in a molten or crystalline state. Considering the dielectric properties of the composition, molten silicon dioxide such as 525ARI of Sibelco Bao Lin is preferred.

(d) flame retardant, which makes up 10-20 wt %, by weight of the total solid content of the resin composition, and can be bromine-based flame retardant or phosphor-based flame retardant.

A bromine-based flame retardant if chosen is selected from any one of those manufactured and sold by Albemarle Corporation of USA under the trade names Saytex BT 93 W (ethylene bistetrabromophthalimide) flame retardant, Saytex 120 (tetradecabromodiphenoxy benzene) flame retardant, Saytex 8010 (ethane-1,2-bis(pentabromophenyl)) flame retardant, and Saytex 102 (decabromo diphenoxy oxide) flame retardant.

A phosphor-based flame retardant if chosen is selected from one or a combination of the following: a phosphate-based flame retardant such as triphenyl phosphate (TPP), resorcinol bis(diphenyl phosphate) (RDP), BPAPP, BBC, CR-733S, or PX-200; a phosphazene-based flame retardant such as SPB-100; an ammonium polyphosphate-based flame retardant; a melamine polyphosphate (MPP)-based flame retardant; a melamine cyanurate-based flame retardant; and an aluminum-containing hypophosphate-based flame retardant such as OP935. When added to a PPE resin, a bromine-based flame retardant produces a higher glass transition temperature than a phosphor-based flame retardant.

(e) crosslinking agent, which makes up 2-20 wt %, by weight of the total solid content of the resin composition, and serves to increase the degree of crosslinking of a thermosetting resin. The crosslinking agent is one or more selected from the group consisting of triallyl cyanurate, triallyl isocyanurate (TAIL), diallyl phthalate, divinylbenzene and 1,2,4-triallyl trimellitate.

(f) hardening initiator, which makes up 0.1-3 wt %, by weight of the total solid content of the resin composition, and serves to accelerate crosslinking. When the resin composition of the present invention is heated, the initiator decomposes into free radicals to initiate crosslinking polymerization. The hardening initiator is selected from organic peroxide or/and tert-butyl cumyl peroxide; preferably, the hardening initiator is selected from 1,1-di-(tert-butylperoxy)-3,3,5-trimethylcyclohexane, 2,5-di(tert-butylperoxy)-2,5-dimethyl-3-hexyne, di-tertiary-butyl peroxide (DTBP), 2,5-dimethyl-2,5-di(tert-butylperoxy)hexane (DHBP), tert-butyl peroxybenzoate (TBPB), dicumyl peroxide (DCP), benzoyl peroxide (BP) or cumyl hydroperoxide singly, or in combination thereof.

In addition, the resin composition of the present invention can be added with a coupling agent to improve affinity between the inorganic powder and the resins. The coupling agent can be added directly into the resin composition, or the inorganic powder can be pre-treated with the coupling agent and then used to prepare the resin composition of the present invention.

The thermosetting resin composition of the present invention is further exploited for use in producing a prepreg and a hardened product. Such a prepreg is made by impregnating a reinforcing material with the above-mentioned modified PPE resin composition of the present invention at room temperature (15-40° C.) and drying the resulting composite material at a temperature set at 100-140° C.

A prepreg of the present invention includes a reinforcing material at 10-50 wt % and the modified PPE resin composition of the present invention with which the reinforcing material is impregnated at 50-90 wt %, by weight of the prepreg. The reinforcing material can be selected from glass cloth, non-woven glass cloth, organic fiber cloth, non-woven organic fiber cloth, paper, non-woven liquid crystal polymer cloth, synthetic fiber cloth, carbon fiber cloth, PP cloth, PTFE cloth, and non-woven fabric.

The prepreg can be formed as a semi-cured films (or B-stage prepreg) or a cured films (or prepreg) for use in printed circuit boards. For example, a piece of glass cloth can be impregnated with the resin composition of the present invention and then laminated with copper foil to form a copper foil substrate for making a printed circuit board.

The prepreg of the present invention can be attached with a sheet of copper foil on each of its top and bottom sides and allowed to harden, and the hardened product is a copper foil substrate suitable for making a high-frequency circuit board. The manufacture of such copper foil substrates can be automated for continuous production. More specifically, more than one prepreg is stacked together, and a sheet of 35 μm-thick copper foil is applied to the top surface as well as the bottom surface of the stack. The assembly is kept under a pressure of 25 kg/cm$^2$ and a constant temperature of 85° C. for 20 minutes, before the temperature is increased at 3° C./min to a constant temperature between 150° C. and 190° C., at which the assembly stays for 120 minutes. After that, the assembly is gradually cooled down to 130° C., and a copper foil substrate more than 0.8 mm thick is obtained.

As the thermosetting resin composition of the present invention and the prepregs and copper foil substrates (hardened products) made therewith contain the foregoing thermosetting PPE resin with a staggered structure, they all feature small dielectric constants, low dielectric loss, high Tg, high resistance to heat, and high flame retardancy when hardened, thus fully exhibiting the advantages of the thermosetting PPE resin and hopefully meeting the requirements of high-end printed circuit board specifications.

The following embodiments and comparative examples are provided to shed light on the effects of the present invention. It is understood, however, that the scope of patent protection, if granted, of the present invention is not limited to the embodiments disclosed.

The physical properties of the copper foil substrates made in the embodiments and the comparative examples were evaluated by the methods listed below:
1. Glass transition temperature (° C.):
   This is determined with a dynamic mechanical analyzer (DMA).
2. Water absorbency (%):
   A sample is weighed before and after it is heated in a 120° C., 2-atm pressure cooker for 120 minutes. Then, the change of weight is calculated.
3. Resistance to 288° C. solder heat (seconds):
   A sample is heated in a 120° C., 2-atm pressure cooker for 120 minutes and then immersed in a 288° C. soldering furnace. The time it takes for the sample to delaminate is recorded.
4. Copper coil peel strength (lb/in):
   The peel strength between the copper foil and the circuit carrier is tested.
5. Dielectric constant Dk (1 GHz):
   The dielectric constant Dk at the frequency of 1 GHz is determined with a dielectric analyzer (HP Agilent E4991A).
6. dielectric dissipation factor Df (1 GHz):
   The dielectric dissipation factor Df at the frequency of 1 GHz is determined with a dielectric analyzer (HP Agilent E4991A).

7. Molecular weight of PPE resin:
   A fixed quantity of PPE resin is dissolved in a THF solvent to prepare a 1% solution.
   The solution is heated until it is clarified. Then, gel permeation chromatography (GPC) is carried out, and the areas of the characteristic peaks are calculated to obtain the molecular weight. A calibration curve for the analysis is established by performing multi-point calibration on standard polystyrene specimens of different molecular weights. Only when the calibration curve is created can the molecular weight data of a sample to be tested be accurately obtained.
8. OH value:
   A pyridine solution containing 25 vol. % acetic anhydride is prepared as an acetylation reagent. A few grams of a sample to be tested is precisely weighed and mixed thoroughly with 5 mL of the acetylation reagent. The mixture is heated until the sample is completely dissolved, and phenolphthalein is added into the mixture as an indicator. Titration is then carried out with an ethanol solution of 0.5-N potassium hydroxide.
9. Rigidity:
   This is determined with a DMA and expressed by the G' value (storage modulus, GPa) at 50° C.

Synthesis Example 1

(1) Cracking reaction: 215 g of a large-molecular-weight PPE resin (with a number-average molecular weight of 27,460 g/mole) was introduced into 500 mL of toluene. The mixture was stirred and heated to 90° C. to enhance dissolution. Stirring continued for 2 hours after the temperature reached 90° C. Once the PPE resin dissolved completely, 26.9 g of bisphenol A (BPA) and 31.4 g of benzoyl peroxide (BPO) were added sequentially, and reaction was allowed to continue for 6 hours. After that, molecular weight was determined by GPC, and the number-average molecular weight obtained is 3,530 g/mole.

(2) Washing: The reaction solution was washed several times with an alkali liquor and pure water to obtain a small-molecular-weight, hydroxyl-terminated PPE resin (with an OH value of 46.3 mgKOH/g).

(3) Grafting reaction: The small-molecular-weight, hydroxyl-terminated PPE resin solution was heated to 75° C., before 0.25 g of tetrabutylammonium bromide (TBAB), serving as a phase transfer catalyst, and 22.2 g of an aqueous solution of 45% NaOH were successively added for reaction for 1 hour to form a phenolic group-terminated sodium salt. After the 1-hour period elapsed, 38.1 g of 4-chloromethane styrene was added in droplets over 1 hour, followed by 10 hours of reaction.

(4) Purification: The reaction solution was poured into a methanol solvent with a volume (3000 mL) five times as great as the volume of the reaction solution and was allowed to precipitate. The precipitate was washed several times with ethanol and water to obtain a thermosetting PPE resin, designated PPE-A (with a number-average molecular weight of 3,860 and an OH value of 0.02 mgKOH/g).

Synthesis Example 2

(1) Cracking reaction: 215 g of a large-molecular-weight PPE resin (with a number-average molecular weight of 27,460 g/mole) was introduced into 500 mL of toluene. The mixture was stirred and heated to 90° C. to enhance dissolution. Stirring continued for 2 hours after the temperature reached 90° C. Once the PPE resin dissolved completely, 10.8 g of bisphenol A (BPA) and 12.6 g of benzoyl peroxide (BPO) were added sequentially, and reaction was allowed to continue for 6 hours. After that, molecular weight was determined by GPC, and the number-average molecular weight obtained is 14,580 g/mole.

(2) Washing: The reaction solution was washed several times with an alkali liquor and pure water to obtain a small-molecular-weight, hydroxyl-terminated PPE resin (with an OH value of 12.5 mgKOH/g).

(3) Grafting reaction: The small-molecular-weight, hydroxyl-terminated PPE resin solution was heated to 75° C., before 0.5 g of tetrabutylammonium bromide (TBAB), serving as a phase transfer catalyst, and 5.6 g of an aqueous solution of 45% NaOH were successively added for reaction for 1 hour to form a phenolic group-terminated sodium salt. After the 1-hour period elapsed, 9.6 g of 4-chloromethane styrene was added in droplets over 1 hour, followed by 12 hours of reaction.

(4) Purification: The reaction solution was poured into a methanol solvent with a volume (3000 mL) five times as great as the volume of the reaction solution and was allowed to precipitate. The precipitate was washed several times with ethanol and water to obtain a thermosetting PPE resin, designated PPE-B (with a number-average molecular weight of 14,895 and an OH value of 0.03 mgKOH/g).

Synthesis Example 3

(1) Cracking reaction: 215 g of a large-molecular-weight PPE resin (with a number-average molecular weight of 27,460 g/mole) was introduced into 500 mL of toluene. The mixture was stirred and heated to 90° C. to enhance dissolution. Stirring continued for 2 hours after the temperature reached 90° C. Once the PPE resin dissolved completely, 10.8 g of bisphenol A (BPA) and 12.6 g of benzoyl peroxide (BPO) were added sequentially, and reaction was allowed to continue for 6 hours. After that, molecular weight was determined by GPC, and the number-average molecular weight obtained is 14,580 g/mole.

(2) Washing: The reaction solution was washed several times with an alkali liquor and pure water to obtain a small-molecular-weight, hydroxyl-terminated PPE resin (with an OH value of 12.5 mgKOH/g).

(3) Grafting reaction: The small-molecular-weight, hydroxyl-terminated PPE resin solution was heated to 75° C., before 0.5 g of tetrabutylammonium bromide (TBAB), serving as a phase transfer catalyst, and 3.35 g of an aqueous solution of 45% NaOH were successively added for reaction for 1 hour to form a phenolic group-terminated sodium salt. After the 1-hour period elapsed, 6.14 g of 4-chloromethane styrene was added in droplets over 1 hour, followed by 12 hours of reaction.

(4) Purification: The reaction solution was poured into a methanol solvent with a volume (3000 mL) five times as great as the volume of the reaction solution and was allowed to precipitate. The precipitate was washed several times with ethanol and water to obtain a thermosetting PPE resin, designated PPE-C (with a number-average molecular weight of 14,760 and an OH value of 4.2 mgKOH/g).

Synthesis Example 4

(1) Cracking reaction: 215 g of a large-molecular-weight PPE resin (with a number-average molecular weight of 27,460 g/mole) was introduced into 500 mL of toluene. The mixture was stirred and heated to 90° C. to enhance dissolution. Stirring continued for 2 hours after the temperature reached 90° C. Once the PPE resin dissolved completely, 14.6 g of diallyl bisphenol A (diallyl BPA) was added, followed by 12.6 g of benzoyl peroxide (BPO) and 0.25 g of p-benzoquinone serving as a retardant. Reaction was allowed to continue for 6 hours. After that, molecular weight was determined by GPC, and the number-average molecular weight obtained is 14,650 g/mole.

(2) Washing: The reaction solution was washed several times with an alkali liquor and pure water to obtain a small-molecular-weight, hydroxyl-terminated PPE resin (with an OH value of 12.2 mgKOH/g).

(3) Grafting reaction: The small-molecular-weight, hydroxyl-terminated PPE resin solution was heated to 75° C., before 0.5 g of tetrabutylammonium bromide (TBAB), serving as a phase transfer catalyst, and 5.55 g of an aqueous solution of 45% NaOH were successively added for reaction for 1 hour to form a phenolic group-terminated sodium salt. After the 1-hour period elapsed, 9.52 g of 4-chloromethane styrene was added in droplets over 1 hour, followed by 12 hours of reaction.

(4) Purification: The reaction solution was poured into a methanol solvent with a volume (3000 mL) five times as great as the volume of the reaction solution and was allowed to precipitate. The precipitate was washed several times with ethanol and water to obtain a thermosetting PPE resin, designated PPE-D (with a number-average molecular weight of 14,985 and an OH value of 0.6 mgKOH/g).

Synthesis Example 5

(1) Cracking reaction: 215 g of a large-molecular-weight PPE resin (with a number-average molecular weight of 27,460 g/mole) was introduced into 500 mL of toluene. The mixture was stirred and heated to 90° C. to enhance dissolution. Stirring continued for 2 hours after the temperature reached 90° C. Once the PPE resin dissolved completely, 14.6 g of diallyl bisphenol A (diallyl BPA) was added, followed by 12.6 g of benzoyl peroxide (BPO) and 0.25 g of p-benzoquinone serving as a retardant. Reaction was allowed to continue for 6 hours. After that, molecular weight was determined by GPC, and the number-average molecular weight obtained is 14,650 g/mole.

(2) Washing: The reaction solution was washed several times with an alkali liquor and pure water to obtain a small-molecular-weight, hydroxyl-terminated PPE resin (with an OH value of 12.2 mgKOH/g).

(3) Grafting reaction: The small-molecular-weight, hydroxyl-terminated PPE resin solution was heated to 75° C., before 0.5 g of tetrabutylammonium bromide (TBAB), serving as a phase transfer catalyst, and 3.33 g of an aqueous solution of 45% NaOH were successively added for reaction for 1 hour to form a phenolic group-terminated sodium salt. After the 1-hour period elapsed, 6.09 g of 4-chloromethane styrene was added in droplets over 1 hour, followed by 12 hours of reaction.

(4) Purification: The reaction solution was poured into a methanol solvent with a volume (3000 mL) five times as great as the volume of the reaction solution and was allowed to precipitate. The precipitate was washed several times with ethanol and water to obtain a thermosetting PPE resin, designated PPE-E (with a number-average molecular weight of 14,940 and an OH value of 3.2 mgKOH/g).

Synthesis Example 6

(1) Cracking reaction: 215 g of a large-molecular-weight PPE resin (with a number-average molecular weight of 27,460 g/mole) was introduced into 500 mL of toluene. The mixture was stirred and heated to 90° C. to enhance dissolution. Stirring continued for 2 hours after the temperature reached 90° C. Once the PPE resin dissolved completely, 14.6 g of diallyl bisphenol A (diallyl BPA) was added, followed by 12.6 g of benzoyl peroxide (BPO) and 0.25 g of p-benzoquinone serving as a retardant. Reaction was allowed to continue for 6 hours. After that, molecular weight was determined by GPC, and the number-average molecular weight obtained is 14,650 g/mole.

(2) Washing: The reaction solution was washed several times with an alkali liquor and pure water to obtain a small-molecular-weight, hydroxyl-terminated PPE resin (with an OH value of 12.2 mgKOH/g).

(3) Grafting reaction: The small-molecular-weight, hydroxyl-terminated PPE resin solution was heated to 80° C., before 0.5 g of tetrabutylammonium bromide (TBAB), serving as a phase transfer catalyst, and 5.55 g of an aqueous solution of 45% NaOH were successively added for reaction for 1 hour to form a phenolic group-terminated sodium salt. After the 1-hour period elapsed, 4.37 g of 2-chloromethane styrene was added in droplets over 1 hour, followed by 10 hours of reaction.

(4) Purification: The reaction solution was poured into a methanol solvent with a volume (3000 mL) five times as great as the volume of the reaction solution and was allowed to precipitate. The precipitate was washed several times with ethanol and water to obtain a thermosetting PPE resin, designated PPE-F (with a number-average molecular weight of 14,780 and an OH value of 0.5 mgKOH/g).

Synthesis Example 7

(1) Cracking reaction: 215 g of a large-molecular-weight PPE resin (with a number-average molecular weight of 39,582 g/mole) was introduced into 500 mL of toluene. The mixture was stirred and heated to 90° C. to enhance dissolution. Stirring continued for 2 hours after the temperature reached 90° C. Once the PPE resin dissolved completely, 7.4 g of bisphenol A (BPA) and 8.63 g of benzoyl peroxide (BPO) were added sequentially, and reaction was allowed to continue for 6 hours. After that, molecular weight was determined by GPC, and the number-average molecular weight obtained is 20,134 g/mole.

(2) Washing: The reaction solution was washed several times with an alkali liquor and pure water to obtain a small-molecular-weight, hydroxyl-terminated PPE resin (with an OH value of 9.4 mgKOH/g).

(3) Grafting reaction: The small-molecular-weight, hydroxyl-terminated PPE resin solution was heated to 80° C., before 0.5 g of tetrabutylammonium bromide (TBAB), serving as a phase transfer catalyst, and 1.32 g of an aqueous solution of 45% NaOH were successively added for reaction for 1 hour to form a phenolic group-terminated sodium salt. After the 1-hour period elapsed, 2.27 g of 4-chloromethane styrene was added in droplets over 1 hour, followed by 10 hours of reaction.

(4) Purification: The reaction solution was poured into a methanol solvent with a volume (3000 mL) five times as great as the volume of the reaction solution and was allowed to precipitate. The precipitate was washed several times with ethanol and water to obtain a thermosetting PPE resin, designated PPE-G (with a number-average molecular weight of 20,856 and an OH value of 6.8 mgKOH/g).

Synthesis Example 8

(1) Catalyst preparation: Into a beaker were added 0.3 g of cuprous oxide ($Cu_2O$, CAS:1317-39-1), 3.7 g of 48% hydrobromic acid (48% HBr(aq), CAS:10035-10-6), 13 g of N,N-dimethyl butylamine (CAS:927-62-8), 4.7 g of di-butylamine (CAS:111-92-2), 1.3 g of N,N-di-tert-butylethylene diamine (CAS:4062-60-6), and 1.2 g of a surfactant. The beaker was vibrated in an ultrasound vibrator at 25° C. for 30 minutes to produce the catalyst.

(2) Synthesis: 600 g of 2,6-DMP, 100 g of AMP, and 5,000 g of toluene were put into a gas-guiding magnetic-shaft-seal agitator capable of gas extraction, gas discharge, and agitation, followed by the prepared catalyst. Then, a gas mixture of nitrogen and oxygen was guided into the reactor, in which the gas phase had an oxygen concentration controlled below 8% (mol/mol), a constant pressure of 10 kg/cm2, and a temperature kept at 25° C. After that, the agitator of the reactor was activated to enable oxidative copolymerization. Samples were taken every 10 minutes for molecular weight analysis, and reaction was stopped when Mn reached 20,000.

(3) Washing: 5000 g of toluene was added into the reaction solution (crude product) to reduce the concentration and viscosity of PPE. Then, copper ions were removed by extraction with an aqueous solution of 0.1% ethylenediaminetetraacetic acid (EDTA, CAS:60-00-4) serving as a chelating agent. Once the water layer was separated, a PPE intermediate product solution was obtained.

(4) Purification: With methanol, PPE resin particles were precipitated from the PPE intermediate product solution, and the precipitate was drained and dried to obtain the PPE product. The PPE product, designated PPE-H, was analyzed (Mn=21,268, OH value=6.8 mgKOH/g) and weighed (670 g).

Synthesis Example 9

(1) Catalyst preparation: Into a beaker were added 0.45 g of CuCl (CAS:7758-89-6), 2.23 g of 37% hydrochloric acid (37% HCl(aq), CAS:7647-01-0), 12 g of N,N-dimethyl butylamine (CAS:927-62-8), 4.5 g of di-butylamine (CAS:111-92-2), 1.2 g of N,N-di-tert-butylethylene diamine (CAS:4062-60-6), and 1.2 g of a surfactant. The beaker was vibrated in an ultrasound vibrator at 25° C. for 30 minutes to produce the catalyst.

(2) Synthesis: 600 g of 2,6-DMP, 100 g of AMP, and 5,000 g of butanol were put into a gas-guiding magnetic-shaft-seal agitator capable of gas extraction, gas discharge, and agitation, followed by the prepared catalyst. Then, a gas mixture of nitrogen and oxygen was guided into the reactor, in which the gas phase had an oxygen concentration controlled below 8% (mol/mol), a constant pressure of 10 kg/cm2, and a temperature kept at 25° C. After that, the agitator of the reactor was activated to enable oxidative copolymerization. The reaction continued for 2 hours before it was stopped.

(3) Washing: The crude product (slurry) of the reaction was drained, and the PPE cake obtained was placed in 7,000 g of toluene to dissolve the PPE. Copper ions were then removed by extraction with an aqueous solution of 0.1% ethylenediaminetetraacetic acid (EDTA, CAS:60-00-4) serving as a chelating agent. Once the water layer was separated, a PPE intermediate product solution was obtained.

(4) Purification: With methanol, PPE resin particles were precipitated from the PPE intermediate product solution, and the precipitate was drained and dried to obtain the PPE product. The PPE product was analyzed (Mn=3,225, OH value=51.2 mgKOH/g) and weighed (640 g).

(5) Grafting reaction: The small-molecular-weight PPE resin was dissolved in toluene and heated to 80° C. Then, 0.6 g of tetrabutylammonium bromide (TBAB), serving as a phase transfer catalyst, and 64.9 g of an aqueous solution of 45% NaOH were sequentially added for reaction for 1 hour to form a phenolic group-terminated sodium salt. After the 1-hour period elapsed, 111.4 g of 4-chloromethane styrene was added in droplets over 1 hour, followed by 10 hours of reaction.

(6) Purification: The reaction solution was poured into a methanol solvent with a volume five times as great as the volume of the reaction solution and was allowed to precipitate. The precipitate was washed several times with ethanol and water to obtain a thermosetting PPE resin, designated PPE-I (with a number-average molecular weight of 3,549 and an OH value of 0.03 mgKOH/g).

Examples 1-16 and Comparative Examples 1-4

Each resin composition listed in Table 1 was mixed with toluene to form a varnish of that particular thermosetting resin composition. Each varnish was then used to impregnate plural pieces of Nan Ya glass cloth (Cloth Type No. 7628, Nan Ya Plastics Corporation) at room temperature, and the pieces of cloth were dried at 110° C. (in the impregnator) for several minutes to produce prepregs with a resin content of 43 wt %. Four prepregs of the same resin composition were stacked together and sandwiched between two sheets of 35 μm-thick copper foil. Each such assembly was kept under a pressure of 25 kg/cm$^2$ and a constant temperature of 85° C. for 20 minutes, then heated at 3° C./min to 185° C., kept at 185° C. for 120 minutes, and gradually cooled down to 130° C. to form a 0.8 mm-thick copper foil substrate.

The physical properties of the copper foil substrates thus made were tested, and the test results are shown also in Table 1.

Results:
The following conclusions can be drawn from a comparison between the test results of Examples 1-16 in Table 1 and those of Comparative Examples 1-4:
1. All the circuit substrates in embodiments 1-16 were excellent in terms of dielectric constant (Dk) and dielectric dissipation factor (Df). Dielectric constants were all smaller than 3.2, and dielectric dissipation factor, smaller than 0.0020. Besides, all the glass transition temperatures (Tg) were higher than 205° C. As to other physical properties such as copper foil peel strength, water absorbency, resistance to 288° C. solder heat, and flame retardancy, the substrates also gave satisfactory results. In particular, the prepregs were cut with ease, which is a prominent feature of the embodiments.
2. In comparative example 1, in which the percentage of polybutadiene was higher than 15%, both the dielectric constant and dielectric loss were good, but the copper foil peel strength and rigidity were low. In addition, the prepregs were soft and difficult to cut. In practice, therefore, the tension of the prepregs will require adjustment during manufacture, and the cutter needs to be replaced frequently, thus incurring extra cost.
3. Comparative example 2 was free of polybutadiene resin and used 100% high-molecular-weight, styryl-containing PPE. As a result, the substrate was uneven after lamination and unable to be tested.
4. In comparative example 3, the percentage of the cross-linking agent, TAIL, was higher than 20% such that the copper foil's peel strength was low, the glass transition temperature was low, the dielectric constant was large, dielectric loss was high, and heat resistance was low.
5. Comparative example 4 used a commercially available PPE resin (Type No. Sabic 808), whose terminal ends are not functionalized. Consequently, not only did the OH value reach as high as 10.9 mgKOH/g, but also after hardening the glass transition temperature (Tg) was low, heat resistance was low, the substrate's peel strength was low, the dielectric constant was large, and dielectric loss was high.

TABLE 1

Prepreg and substrates' physical properties of Examples

| Composition (by weight) | | | | Example 1 | 2 | 3 | 4 | 5 | 6 | 7 | 8 |
|---|---|---|---|---|---|---|---|---|---|---|---|
| Formula | Polybutadiene resin | High-molecular weight[1] | | 4.4 | 4.4 | 4.4 | — | — | — | — | — |
| | | Low-molecular weight[1] | | 4.4 | 4.4 | 4.4 | 8.8 | 8.8 | 8.8 | 8.8 | 8.8 |
| | PPE resin[2] | PPE-A | | 35 | — | — | 13.2 | 4.4 | 4.4 | 4.4 | 4.4 |
| | | PPE-B | | — | 35 | 35 | 21.8 | 30.6 | — | — | — |
| | | PPE-C | | — | — | — | — | — | 30.6 | — | — |
| | | PPE-D | | — | — | — | — | — | — | 30.6 | — |
| | | PPE-E | | — | — | — | — | — | — | — | 30.6 |
| | | PPE-F | | — | — | — | — | — | — | — | — |
| | | PPE-G | | — | — | — | — | — | — | — | — |
| | | PPE-H | | — | — | — | — | — | — | — | — |
| | | PPE-I | | — | — | — | — | — | — | — | — |
| | | Sabic 808 | | — | — | — | — | — | — | — | — |
| | | OH value[3] | | 0.02 | 0.03 | 0.03 | 0.03 | 0.03 | 3.70 | 0.53 | 2.80 |
| | Crosslinking agent | TAIC | | 4.3 | 4.3 | 4.3 | 4.3 | 4.3 | 4.3 | 4.3 | 4.3 |
| | Flame retardant | BT-93 | | — | — | — | — | — | — | — | — |
| | | OP-935 | | 15.3 | 15.3 | 7.65 | 15.3 | 15.3 | 15.3 | 15.3 | 15.3 |
| | | MPP | | — | — | 7.65 | — | — | — | — | — |
| | Filler | SiO$_2$ | | 35.8 | 35.8 | 35.8 | 35.8 | 35.8 | 35.8 | 35.8 | 35.8 |
| | Initiator | DCP | | 0.4 | 0.4 | 0.4 | 0.4 | 0.4 | 0.4 | 0.4 | 0.4 |
| | | BPO | | 0.4 | 0.4 | 0.4 | 0.4 | 0.4 | 0.4 | 0.4 | 0.4 |
| Glass transition temperature (° C.) (DMA)[4] | | | | 208 | 218 | 218 | 211 | 213 | 208 | 214 | 208 |
| Water absorbency (%)[5] | | | | 0.02 | 0.03 | 0.06 | 0.08 | 0.05 | 0.06 | 0.03 | 0.08 |

TABLE 1-continued

Prepreg and substrates' physical properties of Examples

| | | | | | | | | |
|---|---|---|---|---|---|---|---|---|
| Resistance to 288° C. solder heat (second)[6] | >600 | >600 | >600 | >600 | >600 | >600 | >600 | >600 |
| Copper foil's peel strength (lb/in) | 5.52 | 5.36 | 5.48 | 4.46 | 4.76 | 4.76 | 4.33 | 4.72 |
| Rigidity (storage modulus at 50° C., GPa)[7] | 12.8 | 13.8 | 12.8 | 14.3 | 14.8 | 14.7 | 14.6 | 15.3 |
| Substrate[8] Dielectric constant Dk | 3.14 | 3.11 | 3.13 | 3.18 | 3.19 | 3.18 | 3.12 | 3.17 |
| dielectric dissipation factor Df (×10$^{-3}$) | 1.5 | 1.6 | 1.8 | 1.3 | 1.6 | 1.6 | 1.4 | 1.7 |
| Flame retardancy (UL-94) | V0 | V0 | V0 | V0 | V0 | V0 | V0 | V0 |
| Ease of prepreg cutting[9] | good | good | good | good | good | good | good | good |

| | | | Example | | | | | | | |
|---|---|---|---|---|---|---|---|---|---|---|
| Composition (by weight) | | | 9 | 10 | 11 | 12 | 13 | 14 | 15 | 16 |
| Formula | Polybutadiene resin | High-molecular weight[1] | — | — | 4.4 | 4.4 | — | — | — | 4.4 |
| | | Low-molecular weight[1] | 8.8 | 8.8 | 4.4 | 4.4 | 8.8 | 8.8 | 8.8 | 4.4 |
| | PPE resin[2] | PPE-A | 4.4 | 4.4 | 35 | 35 | — | 4.4 | — | 35 |
| | | PPE-B | — | 15.3 | — | — | — | — | — | — |
| | | PPE-C | — | — | — | — | — | — | — | — |
| | | PPE-D | — | 15.3 | — | — | — | 15.3 | — | — |
| | | PPE-E | — | — | — | — | — | — | — | — |
| | | PPE-F | 30.6 | — | — | — | — | — | — | — |
| | | PPE-G | — | — | — | — | 35 | 15.3 | — | — |
| | | PPE-H | — | — | — | — | — | — | 35 | — |
| | | PPE-I | — | — | — | — | — | — | — | 35 |
| | | Sabic 808 | — | — | — | — | — | — | — | — |
| | | OH value[3] | 0.44 | 0.28 | 0.03 | 0.02 | 6.8 | 3.24 | 6.8 | 0.03 |
| | Crosslinking agent | TAIC | 4.3 | 4.3 | 4.3 | 4.3 | 4.3 | 4.3 | 4.3 | 4.3 |
| | Flame retardant | BT-93 | — | — | 15.3 | — | — | — | — | — |
| | | OP-935 | 15.3 | 15.3 | — | — | 15.3 | 15.3 | 15.3 | 15.3 |
| | | MPP | — | — | — | 15.3 | — | — | — | — |
| | Filler | SiO$_2$ | 35.8 | 35.8 | 35.8 | 35.8 | 35.8 | 35.8 | 35.8 | 35.8 |
| | Initiator | DCP | 0.4 | 0.4 | 0.4 | 0.4 | 0.4 | 0.4 | 0.4 | 0.4 |
| | | BPO | 0.4 | 0.4 | 0.4 | 0.4 | 0.4 | 0.4 | 0.4 | 0.4 |
| Glass transition temperature (° C.) (DMA)[4] | | | 216 | 221 | 220 | 211 | 228 | 225 | 216 | 208 |
| Water absorbency (%)[5] | | | 0.08 | 0.04 | 0.01 | 0.03 | 0.02 | 0.02 | 0.03 | 0.03 |
| Resistance to 288° C. solder heat (second)[6] | | | >600 | >600 | >600 | >600 | >600 | >600 | >600 | >600 |
| Copper foil's peel strength (lb/in) | | | 4.62 | 4.98 | 5.58 | 4.23 | 4.13 | 4.33 | 4.26 | 5.62 |
| Rigidity (storage modulus at 50° C., GPa)[7] | | | 14.8 | 14.7 | 14.5 | 12.5 | 12.8 | 13.9 | 13.2 | 13.6 |
| Substrate[8] Dielectric constant Dk | | | 3.02 | 3.13 | 3.02 | 3.16 | 3.08 | 3.12 | 3.06 | 3.12 |
| dielectric dissipation factor Df (×10$^{-3}$) | | | 1.1 | 1.6 | 1.2 | 1.6 | 1.2 | 1.4 | 1.3 | 1.4 |
| Flame retardancy (UL-94) | | | V0 | V0 | V0 | V0 | V0 | V0 | V0 | V0 |
| Ease of prepreg cutting[9] | | | good | good | good | good | good | good | good | good |

TABLE 2

Prepreg and substrates' physical properties of Comparative Examples

| | | | Comparative Example | | | |
|---|---|---|---|---|---|---|
| Composition (by weight) | | | 1 | 2 | 3 | 4 |
| Formula | Polybutadiene resin | High-molecular weight[1] | 13.2 | — | — | — |
| | | Low-molecular weight[1] | 15.3 | — | 7.2 | 8.8 |
| | PPE resin[2] | PPE-A | 15.3 | — | 3.6 | — |
| | | PPE-B | — | 43.8 | 25.1 | — |
| | | PPE-C | — | — | — | — |
| | | PPE-D | — | — | — | — |
| | | PPE-E | — | — | — | — |
| | | PPE-F | — | — | — | — |
| | | PPE-G | — | — | — | — |
| | | PPE-H | — | — | — | — |
| | | PPE-I | — | — | — | — |
| | | Sabic 808 | — | — | — | 35 |
| | | OH value[3] | 0.03 | 0.03 | 0.03 | 10.9 |
| | Crosslinking agent | TAIC | 4.3 | 4.3 | 21.5 | 4.3 |
| | Flame retardant | BT-93 | 15.3 | — | — | — |
| | | OP-935 | — | 15.3 | 12.5 | 15.3 |
| | | MPP | — | — | — | — |
| | Filler | SiO$_2$ | 35.8 | 35.8 | 29.4 | 35.8 |
| | Initiator | DCP | 0.4 | 0.4 | 0.4 | 0.4 |
| | | BPO | 0.4 | 0.4 | 0.4 | 0.4 |

TABLE 2-continued

Prepreg and substrates' physical properties of Comparative Examples

| Composition (by weight) | Comparative Example | | | |
|---|---|---|---|---|
| | 1 | 2 | 3 | 4 |
| Glass transition temperature (° C.) (DMA)[4] | 208 | — | 183 | 198 |
| Water absorbency (%)[5] | 0.02 | — | 0.26 | 0.36 |
| Resistance to 288° C. solder heat (second)[6] | >600 | — | 300 | 300 |
| Copper foil's peel strength (lb/in) | 2.48 | — | 2.78 | 2.32 |
| Rigidity (storage modulus at 50° C., GPa)[7] | 8.7 | 13.2 | 14.2 | 12.3 |
| Substrate[8] Dielectric constant Dk | 3.13 | — | 3.72 | 3.73 |
| dielectric dissipation factor Df (×10$^{-3}$) | 1.3 | — | 6.3 | 5.8 |
| Flame retardancy (UL-94) | V0 | — | V0 | V0 |
| Ease of prepreg cutting[9] | fair | good | good | good |

Remark:
1. High-molecular weight of polybutadiene resin has a Mw of 140,000; and low-molecular-weight of polybutadiene resin has a Mw of 3900.
2. PPE-A stands for a thermosetting PPE resin prepared from Synthesis Example 1 having a Mn of 3,860 and an OH value of 0.02 mgKOH/g:
    PPE-B stands for a thermosetting PPE resin prepared from Synthesis Example 2 having a Mn of 14,895 and an OH value of 0.03 mgKOH/g;
    PPE-C stands for a thermosetting PPE resin prepared from Synthesis Example 3 having a Mn of 14,760 and an OH value of 4.2 mgKOH/g;
    PPE-D stands for a thermosetting PPE resin prepared from Synthesis Example 4 having a Mn of 14,985 and an OH value of 0.6 mgKOH/g;
    PPE-E stands for a thermosetting PPE resin prepared from Synthesis Example 5 having a Mn of 14,940 and an OH value of 3.2 mgKOH/g;
    PPE-F stands for a thermosetting PPE resin prepared from Synthesis Example 6 having a Mn of 14,780 and an OH value of 0.5 mgKOH/g;
    PPE-G stands for a thermosetting PPE resin prepared from Synthesis Example 7 having a Mn of 20,856 and an OH value of 6.8 mgKOH/g;
    PPE-H stands for a thermosetting PPE resin prepared from Synthesis Example 8 having a Mn of 21,268 and an OH value of 6.8 mgKOH/g;
    PPE-I stands for a thermosetting PPE resin prepared from Synthesis Example 9 having a Mn of 3,549 and an OH value of 0.03 mgKOH/g; and
    Sabic 808: commercially available PPE resin has no terminal unsaturated active functional groups and has a Mn of 20,544 and an OH value of 10.9 mgKOH/g.
3. OH value of a sample is measured from the following method:
    A pyridine solution containing 25 vol. % acetic anhydride is prepared as an acetylation reagent. A few grams of a sample to be tested is precisely weighed and mixed thoroughly with 5 mL of the acetylation reagent. The mixture is heated until the sample is completely dissolved, and phenolphthalein is added into the mixture as an indicator. Titration is then carried out with an ethanol solution of 0.5-N potassium hydroxide.
4. Glass transition temperature is determined with a dynamic mechanical analyzer (DMA) to decide what temperature get the maximum value of tan δ.
5. Water absorbency (%) of a sample is weighed before and after it is heated in a 120° C., 2-atm pressure cooker for 120 minutes. Then, the change of weight is calculated.
6. Resistance to 288° C. solder heat (seconds) of a sample is heated in a 120° C., 2-atm pressure cooker for 120 minutes and then immersed in a 288° C. soldering furnace. The time it takes for the sample to delaminate is recorded.
7. Rigidity of a sample is determined with a DMA and expressed by the G' value (storage modulus, GPa) at 50° C.
8. Substrate is prepreg hardenable to laminate with one or more copper foil as a substrate.
9. The test result to decide whether a prepreg is ease of cutting is ranked into three levels including "good" standing for cutting regularly; "fair" standing for cutting irregularly and "poor" standing for cutting hardly.

What is claimed is:

1. A thermosetting resin composition, by weight of a total solid content of the resin composition, comprising:
    a) a butadiene resin, making up 4-15 wt %; containing a high-molecular-weight polybutadiene resin of 2-13 wt % having a weight-average molecular weight (Mw) higher than 100,000 g/mol and a low-molecular-weight polybutadiene resin of 2-15 wt % having a weight-average molecular weight (Mw) ranged from 1,000 to 10,000 g/mol;
    b) a modified thermosetting polyphenylene ether (PPE) resin, having a number-average molecular weight (Mn) greater than 2,000 and less than or equal to 25,000, making up 30-45 wt %;
    c) an inorganic powder, making up 10-35 wt %;
    d) a flame retardant, making up 10-20 wt %;
    e) a crosslinking agent, making up 2-20 wt %; and
    f) a hardening initiator, making up 0.1-3 wt %;
    wherein the modified thermosetting PPE resin provides a chemical structure which contains one or more benzene rings, one or more terminal unsaturated active functional groups at terminal ends of its own main chain of the chemical structure, and one or more lateral unsaturated active functional groups at side chains of the benzene rings thereof.

2. The thermosetting resin composition of claim 1, wherein the butadiene resin includes the high-molecular-weight resin and the low-molecular-weight resin at a ratio ranged from 0:100 to 50:50 wt %.

3. The thermosetting resin composition of claim 2, wherein each the high-molecular-weight resin and the low-molecular-weight resin contains 1,2-vinyl up to 70 wt %.

4. The thermosetting resin composition of claim 1, wherein the modified thermosetting PPE resin has a chemical structural formula (A) as followed:

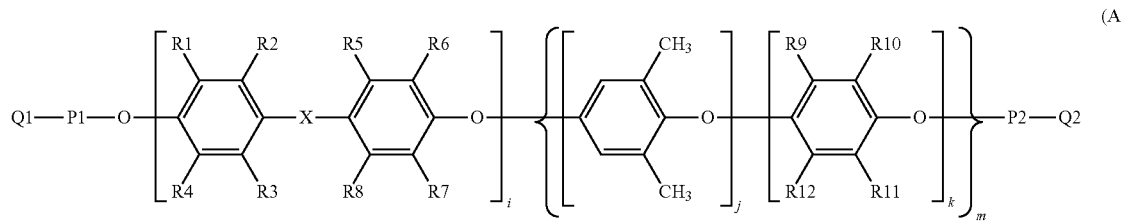

(A)

where R1-R8 each is selected from allyl groups, hydrogen groups or $C_1$-$C_6$ alkyl groups singly, or in combination thereof; and
from R9 to R12 at least has one of them being selected from an allyl group, while each of the rest is selected from a hydrogen group or a C1-C6 alkyl group singly;
where X is selected from one of groups as follows:

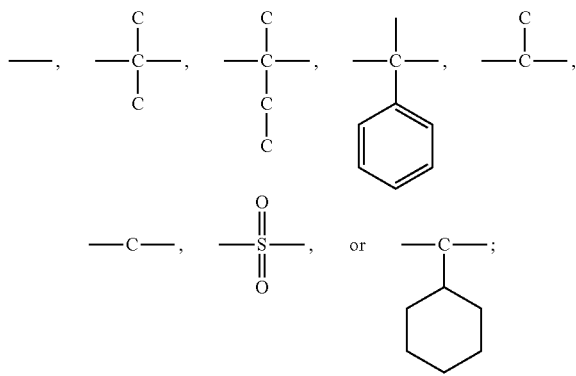

where i, j, k, and m are integers, i is 0 or 1; k≥0; j=1-170; and m≥1; and
where P1 and P2 is selected from

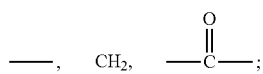

Q1 and Q2 each is selected from a styryl group, a phenylethynyl group, an alkynyl group, a vinyl group, a methyl vinyl group, a benzene ring, a naphthalene ring, or a hydrogen group.

5. The thermosetting resin composition of claim 4, wherein the modified thermosetting PPE resin has a number-average molecular weight (Mn) greater than 2,000 and less than or equal to 13,000 and an OH value smaller than 3.0 mgKOH/g.

6. The thermosetting resin composition of claim 4, wherein the modified thermosetting PPE resin has both a number-average molecular weight (Mn) greater than 2,000 and less than or equal to 13,000 and an OH value smaller than 2.0 mgKOH/g.

7. The thermosetting resin composition of claim 4, wherein the modified thermosetting PPE resin has both a number-average molecular weight (Mn) greater than 13,000 and less than or equal to 25,000 and an OH value smaller than 10.0 mgKOH/g.

8. The thermosetting resin composition of claim 4, wherein the modified thermosetting PPE resin has both a number-average molecular weight (Mn) greater than 13,000 and less than or equal to 25,000 and an OH value smaller than 7.0 mg KOH/g.

9. The thermosetting resin composition of claim 4, wherein the inorganic powder is one or more spherical or irregular powders selected from the group consisting of $SiO_2$, $TiO_2$, $Al(OH)_3$, $Al_2O_3$, $Mg(OH)_2$, MgO, $CaCO_3$ and fumed silica particles.

10. The thermosetting resin composition of claim 4, wherein the flame retardant is bromine-based flame retardant or phosphorus-based flame retardant.

11. The thermosetting resin composition of claim 4, wherein the crosslinking agent is one or more selected from the group consisting of triallyl cyanurate, triallyl isocyanurate (TAIC), diallyl phthalate, divinylbenzene and 1,2,4-triallyl trimellitate.

12. The thermosetting resin composition of claim 4, wherein the hardening initiator is selected from 1,1-di-(tert-butylperoxy)-3,3,5-trimethylcyclohexane, 2,5-di(tert-butylperoxy)-2,5-dimethyl-3-hexyne, di-tertiary-butyl peroxide (DTBP), 2,5-dimethyl-2,5-di(tert-butylperoxy)hexane (DHBP), tert-butyl peroxybenzoate (TBPB), dicumyl peroxide (DCP), benzoyl peroxide (BP) or cumyl hydroperoxide singly, or in combination thereof.

13. A prepreg containing a reinforcing material at 10-50 wt % and the thermosetting resin composition of claim 1 with which the reinforcing material is impregnated at 50-90 wt %, by weight of the prepreg.

14. A copper foil substrate for use in making a printed circuit board, being a hardened product and formed from the prepreg of claim 13 and one or more copper foils, wherein the prepreg has a top side and a bottom side, and the copper foils is attached on the top side and the bottom side of the prepreg.

15. The copper foil substrate of claim 14, having a dielectric constant (Dk) less than 3.2 and a dielectric dissipation factor (Df) less than 0.002 at the frequency of 1 GHz.

* * * * *